United States Patent [19]
Hearn

[11] Patent Number: 5,262,957
[45] Date of Patent: Nov. 16, 1993

[54] INEXPENSIVE PORTABLE RF SPECTRUM ANALYZER WITH CALIBRATION FEATURES

[75] Inventor: Brian F. Hearn, Tallahassee, Fla.

[73] Assignee: Global Communications, Inc., Tallahassee, Fla.

[21] Appl. No.: 611,279

[22] Filed: Nov. 9, 1990

[51] Int. Cl.⁵ .................................................. G01R 23/16
[52] U.S. Cl. .................................... 364/485; 324/76.19
[58] Field of Search .................... 364/485, 483, 571.01, 364/571.04, 571.07, 572; 324/77 B, 77 R, 77 G; 340/721, 722, 728, 729, 734

[56] References Cited

U.S. PATENT DOCUMENTS

| | | | |
|---|---|---|---|
| 3,428,791 | 2/1969 | Chandos | 364/485 |
| 3,546,440 | 12/1970 | Fawcett, Jr. et al. | 364/485 |
| 3,573,446 | 1/1971 | Bergland | 324/77 B |
| 3,631,339 | 12/1971 | Low | 324/77 G |
| 3,681,577 | 8/1972 | Gasiunas | 324/77 B |
| 3,708,746 | 1/1973 | Willett | 328/167 |
| 3,815,032 | 6/1974 | Parker et al. | 328/167 |
| 3,824,471 | 7/1974 | Mills | 179/84 VF |
| 3,863,030 | 7/1975 | Mills | 179/84 VF |
| 3,876,946 | 8/1975 | LaClair et al. | 324/77 CS |
| 3,988,667 | 10/1976 | Roth et al. | 324/77 B |
| 4,092,594 | 5/1978 | Baker | 325/21 |
| 4,093,989 | 6/1978 | Flink et al. | 364/485 |
| 4,146,859 | 3/1979 | Quirke | 336/130 |
| 4,162,531 | 7/1979 | Rode et al. | 364/571.02 |
| 4,198,677 | 4/1980 | Brunner et al. | 364/571.02 |
| 4,200,933 | 4/1980 | Nickel et al. | 364/573 |
| 4,207,431 | 6/1980 | McVoy | 179/153.1 R |
| 4,241,416 | 12/1980 | Tarczy-Hornoch | 371/14 |
| 4,244,024 | 1/1981 | Marzalek et al. | 324/77 B |
| 4,253,152 | 2/1981 | Holdaway | 364/485 |
| 4,257,104 | 3/1981 | Martin et al. | 324/77 B |
| 4,264,958 | 4/1981 | Rowell, Jr. et al. | 364/553 |
| 4,270,177 | 5/1981 | Endoh et al. | 364/571.02 |
| 4,270,217 | 5/1981 | Baker | 455/165 |
| 4,280,140 | 7/1981 | Skerlos | 455/180 |
| 4,286,326 | 8/1981 | Houdard | 364/485 |
| 4,317,227 | 2/1982 | Skerlos | 455/180 |
| 4,337,517 | 6/1982 | Nickel et al. | 364/573 |
| 4,364,027 | 12/1982 | Murooka | 364/571.02 |
| 4,397,038 | 8/1983 | Rzeszewski | 455/183 |
| 4,408,227 | 10/1983 | Bradley | 358/139 |
| 4,409,688 | 10/1983 | Baker | 455/165 |
| 4,430,611 | 2/1984 | Boland | 324/77 B |
| 4,445,679 | 6/1984 | Fathauer et al. | 455/165 |
| 4,453,218 | 6/1984 | Sperinde et al. | 364/572 |
| 4,461,036 | 7/1984 | Williamson et al. | 455/165 |
| 4,476,579 | 10/1984 | Ito et al. | 455/147 |
| 4,509,132 | 4/1985 | Kavaya | 364/578 |
| 4,510,601 | 4/1985 | Delpit et al. | 179/84 VF |
| 4,539,518 | 9/1985 | Kitayoshi | 324/77 B |
| 4,542,638 | 9/1985 | Tlaker | 364/571.02 |
| 4,554,663 | 11/1985 | Pham van Cang | 371/20 |
| 4,573,133 | 2/1986 | White | 364/553 |
| 4,578,638 | 3/1986 | Takano et al. | 364/572 |
| 4,633,173 | 12/1986 | Kashiwagi | 324/77 A |
| 4,652,816 | 3/1987 | Crookshanks | 324/77 B |
| 4,667,151 | 5/1987 | Crookshanks | 324/77 B |
| 4,672,308 | 6/1987 | Leikus | 324/77 B |
| 4,685,065 | 8/1987 | Braun et al. | 324/77 B |

(List continued on next page.)

Primary Examiner—Jack B. Harvey
Assistant Examiner—Ellis B. Ramirez
Attorney, Agent, or Firm—Nixon & Vanderhye

[57] ABSTRACT

An inexpensive portable RF (radio frequency) microcontroller-based digital spectrum analyzer is automatically calibrated for passband amplitude tilt/variations. Resulting software-obtained calibration parameters are used during operation to reduce or eliminate passband amplitude errors. The spectrum analyzer also includes a PLL frequency synthesizer arrangement, but the PLL controls a VCO only during calibration to derive calibration values for controlling a digital-to-analog converter. During normal operation, the VCO is driven in an open loop configuration under software control using such calibration values—achieving nearly the accuracy of closed loop operation while avoiding the penalty of long PLL lock time. These amplitude and frequency calibration techniques and arrangements permit the spectrum analyzer to have relatively inexpensive components and circuit arrangements and nevertheless achieve high accuracy over a wide band.

21 Claims, 11 Drawing Sheets

U.S. PATENT DOCUMENTS

| | | | |
|---|---|---|---|
| 4,703,433 | 10/1987 | Sharrit | 364/485 |
| 4,714,929 | 12/1987 | Davidson | 364/572 |
| 4,733,234 | 3/1988 | Sparks et al. | 324/77 B |
| 4,758,783 | 7/1988 | Danzeisen | 324/77 B |
| 4,801,861 | 1/1989 | Ashley et al. | 324/77 E |
| 4,839,583 | 6/1989 | Takano et al. | 364/485 |
| 4,858,159 | 8/1989 | Wheelwright et al. | 364/485 |
| 4,896,102 | 1/1990 | DuBois | 324/77 B |
| 4,918,373 | 4/1990 | Newberg | 324/77 K |
| 4,975,633 | 12/1990 | Toda et al. | 364/485 |
| 5,038,096 | 8/1991 | Obie et al. | 324/77 B |
| 5,038,097 | 8/1991 | Imanaka | 324/77 B |

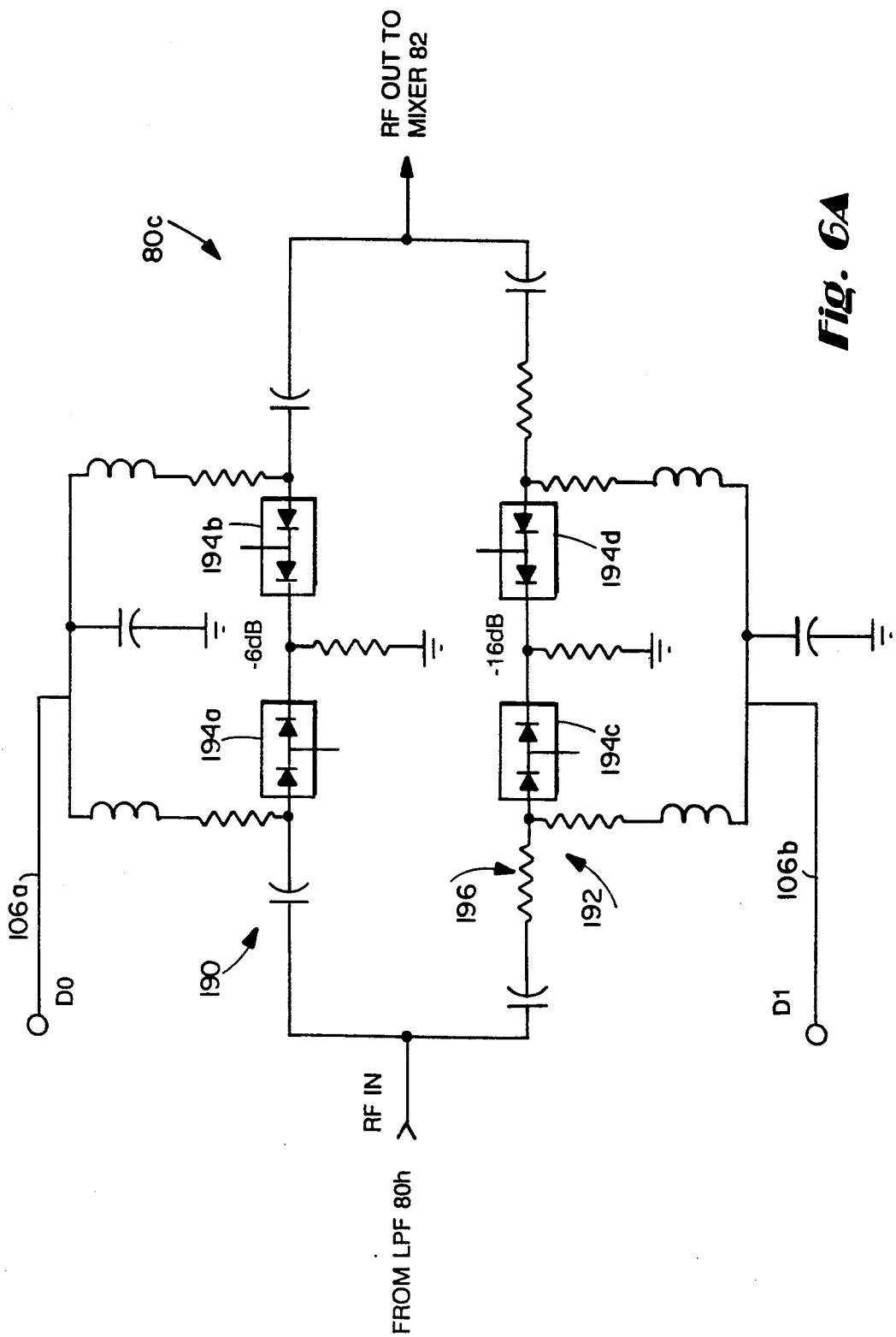

INEXPENSIVE PORTABLE RF SPECTRUM ANALYZER WITH CALIBRATION FEATURES

FIELD OF THE INVENTION

This invention relates to radio frequency (RF) spectrum analyzers, and more particularly to small (e.g., portable spectrum analyzers having inexpensive circuitry and improved calibration features.

BACKGROUND AND SUMMARY OF THE INVENTION

Installing and calibrating a complex RF system such as a satellite earth station or a cable television network requires a test equipment capable of measuring various RF signal parameters (e.g., the frequency and amplitude of RF signals).

Spectrum analyzers have long been used in the laboratory and in well equipped test facilities for analyzing RF signals. Spectrum analyzers are extremely useful because they display or plot amplitudes of significant RF signal components as a function of frequency. A spectrum analyzer typically provides a two-dimensional display (e.g., on a CRT or LCD type graphical display device) wherein the ordinate (y) axis corresponds to amplitude of RF signals and the abscissa (x) axis corresponds to frequency. FIG. 1 is a typical exemplary spectrum analyzer display output. By looking at such a display, a technician can almost instantly determine whether desired signals are missing or have abnormal amplitudes, and can also adjust the system to change relative or absolute amplitudes of certain signals. For these and other reasons, a spectrum analyzer is potentially one of the most useful pieces of test equipment in a microwave technician's toolbox.

Unfortunately, RF spectrum analyzers capable of operating at high (e.g., microwave) frequencies tend to be extremely costly. Modern digital electronics and state of the art solid state microwave components (many of which are hybrid and include digital as well as analog circuitry) have paved the way for the development of digital UHF equipment (including spectrum analyzers) that is sufficiently inexpensive and portable to be available even to field technicians. For example, so-called "sampling" type spectrum analyzers have been developed which operate by sampling signal amplitudes at discrete frequencies. U.S. Pat. No. 4,685,065 to Braun et al describes a portable sampling microcontroller-based digitally controlled spectrum analyzer providing a sweep mode in which signal amplitudes are displayed on an LCD display in bar graph form. Although such "sampling" type spectrum analyzers are particularly suited to digital control and other circuitry, they are still relatively expensive (e.g., a few thousand dollars each).

Cost continues to be a highly significant factor in marketing spectrum analyzers to people who need them. A few thousand dollars is generally too much to spend in the satellite and cable television industry to equip the average field technician with a single piece of equipment (no matter how useful it may be to him or her). Therefore, there is high demand for further improvements in sampling type digital RF spectrum analyzers that might decrease cost and complexity. Ideally, a portable RF spectrum analyzer should cost in the neighborhood of no more than about a thousand dollars or so, since this cost would not be prohibitive for field technician equipment.

Unfortunately, there are significant problems involved in providing a sufficiently accurate yet sufficiently inexpensive broadband VHF or UHF RF spectrum analyzer. These problems have caused prior art spectrum analyzers to be either too expensive, inaccurate, or both.

Since a spectrum analyzer displays RF signal amplitude as a function of frequency, accuracy considerations typically center around two RF factors: (a) the accuracy of the spectrum analyzer RF frequency selection (tuning) function, and (b) the accuracy of the spectrum analyzer amplitude detection function.

Frequency control errors can cause the spectrum analyzer to tune to frequencies other than those that are specified or desired. This can cause the spectrum analyzer to fail to detect some RF signals altogether, or to detect signals in a faulty or incomplete manner (for example, a mistuned spectrum analyzer might not center a certain RF frequency of interest within the analyzer passband, and thus might indicate an incorrect signal amplitude. Amplitude detection errors can also cause the spectrum analyzer display to misrepresent the amplitude of signal components, thus substantially decreasing the value of the information provided by the analyzer.

In some RF applications it is possible to decrease circuit cost and complexity while maximizing performance by optimizing a circuit arrangement for a particular frequency of interest. But since spectrum analyzers by definition must operate across a range or band of frequencies (and spectrum analyzer users may want this band to be wide, it is generally not possible to optimize "front end" and/or detection circuitry for a specific RF frequency. Rather, the spectrum analyzer circuitry must be capable of performing accurately across the entire frequency range of interest. It may be important for a spectrum analyzer to operate across a relatively wide frequency range e.g., the 950 MHz to 1450 MHz down-converted standard satellite television band available at the input of a standard satellite television receiver). Unfortunately, most microwave receivers are usable to simultaneously fulfill the requirements of (a) ultra high frequency operation, (b) wide bandwidth, (c) low frequency and amplitude error, and (d) low cost.

Thus, for example, low cost microwave RF amplifier stages capable of operating across a wide range of UHF frequencies typically have poor (i.e., not very "flat",) frequency response characteristics (i.e., they amplify signals at some frequencies more than they amplify signals at other frequencies, generating amplitude variations at their outputs that have nothing to do within actual input signal amplitude but which instead depend upon the idiosyncrasies of the amplifier stages themselves. Some such amplitude variations across the band spectrum are inherently created in any RF front end. In the case of inexpensive front end circuits, however, passband ripple/tilt would, if uncorrected, be reflected in amplitude errors produced on the spectrum analyzer display. Passband amplitude non-linearity can be reduced by using circuit arrangements carefully designed to provided good linearity, but such circuit arrangements are generally cost-prohibitive in the context of a low-cost hand-held spectrum analyzer.

Although digitally controlled PLL (phase locked loop) frequency synthesizer technology has advanced to a point where PLLs commonly provide highly accurate UHF frequency outputs across a wide frequency range, even this technology cannot meet to the demands placed upon the local oscillator of a UHF broadband sampling spectrum analyzer. A sampling spectrum analyzer must rapidly sample many discrete frequencies access a wide band in order to "sweep" across the frequency range of interest.

In PLL design it is generally necessary to trade off loop response time for wide bandwidth with a large number of frequency increments. A UHF spectrum analyzer must provide relatively narrowly spaced frequency increments (e.g., 5 MHz) over a relatively wide frequency range (e.g., on the order of 500 MHz). At these frequencies, a PLL used to control the VCO must provide a rather large "divide-by-N" factor (the local oscillator frequency must be relatively low in order to provide requisite frequency base stability and resolution) causing dramatic increase of the PLL lock time. It is generally not possible to provides a phase locked loop that can rapidly lock on to a large number of frequency points over a wide frequency range; rapid loop lock times are generally achievable only in loops having small operating frequency ranges and/or a small number of controllable frequency increments. Unfortunately, it is necessary in a spectrum analyzer to sweep the local oscillator frequency across the wide spectrum at relatively rapid rate (e.g. 4 full sweeps per second) -- and the PLL VCO must thus provide as many as 400 frequency changes per second.

This serious shortcoming in PLL performance has in the past required either slower scan times, fewer frequency sampling points, or increased frequency synthesizer complexity (e.g., use of multiple PLLs with their outputs mixed together).

Moreover, inexpensive components typically offer decreased precision and accuracy and may also tend to drift in response to temperature or other variations. For example, inexpensive digital-to-analog converters typically offer poor precision and accuracy; yet, such converters providing requisite precision and accuracy may be too expensive for use in a spectrum analyzer that is to sell for no more than a thousand dollars.

The spectrum analyzer described in the Braun patent does not solve the problems mentioned above. This system is generally too expensive and does not provide UHF (e.g., on the order of 1000 MHz) operating range. Braun's system provides a VCO which is operated under PLL control—thus exhibiting seriously limiting the scanning rate and/or number of samples across a wide band. The Braun patent discloses that "the microprocessor maintains proper [amplitude] calibration of the instrument by turning off the input signal, switching on the noise source 5, and taking level readings." See column 8, lines 37-39. However, Braun does not disclose any way to provide accurate automatic amplitude calibration using inexpensive RF components.

Danzelsen U.S. Pat. No. 4,758,783 discloses a spectrum analyzer that includes a digital memory used to store frequency dependent amplitude control values. The memory contents are converted to analog form by a DAC and used to control the gain of a variable gain I amplifier 5. Memory entries are selected by converting the output of a sweep generator oscillator to digital values, and using the digital values to address the memory. The Danzelsen patent fails to disclose any automatic calibration technique for automatically storing values into the memory or for automatically generating such stored values which take DAC non-linearity into account.

U.S. Pat. No. 3,681,577 to Gasiunas teaches a digital gain correction/calibration arrangement for a multiple channel atomic spectroscopy analyzer.

U.S. Pat. No. 4,652,816 to Crookshanks discloses a spectrum analyzer having a memory providing digital calibration phase and amplitude control obtained by network analysis.

U.S. Pat. Nos. 4,430,611 and 4,672,308 disclose spectrum analyzers providing various techniques for reducing frequency errors.

The following additional patents are generally relevant to instrumentation calibration techniques:

U.S. Pat. No. 3,988,667 to Roth et al;
U.S. Pat. No. 4,162,531 to Rode et al;
U.S. Pat. No. 4,198,677 to Brunner et al;
U.S. Pat. No. 4,200,933 to Nickel et al;
U.S. Pat. No. 4,270,177 to Endoh et al;
U.S. Pat. No. 4,377,517 to Nickel et al;
U.S. Pat. No. 4,453,218 to Sperinde et al;
U.S. Pat. No. 4,509,132 to Kavaya;
U.S. Pat. No. 4,542,638 to Tlaker;
U.S. Pat. No. 4,573,133 to White;
U.S. Pat. No. 4,633,173 to Kashiwagi;
U.S. Pat. No. 4,667,151 to Crookshanks;
U.S. Pat. No. 4,703,433 to Sharrit;
U.S. Pat. No. 4,714,929 to Davidson;
U.S. Pat. No. 4,733,234 to Sparks et al;
U.S. Pat. No. 4,801,861 to Ashley et al;
U.S. Pat. No. 4,858,159 to Wheelwright; and
U.S. Pat. No. 4,918,373 to Newberg.

Of these listed patents, the White patent (U.S. Pat. No. 4,573,133) discloses digital map gain correction techniques; Sharrit U.S. Pat. No. 4,703,433 discloses a complex microwave frequency "network analyzer" including Fourier analysis capabilities; Rode et al (U.S. Pat. No. 4,162,531) discloses digital gain adjustment circuitry; and Crookshanks (U.S. Pat. No. 4,667,151) teaches a digital memory controlled RF sweep generator.

None of the prior art described above provides an RF spectrum analyzer that is sufficiently cost effective and accurate and is also capable of operating over a relatively wide RF range.

The present invention, in contrast, provides a hand-held portable low cost frequency spectrum analyzer designed to operate over a wide RF band (e.g., in the so-called "L band" range of 950-1450 MHz). The spectrum analyzer provided by the present invention uses low cost, relatively uncomplicated components and circuit arrangements, but is able to automatically calibrate and compensate for amplitude and frequency errors arising from such components and arrangements. The spectrum analyzer of the present invention thus provides low cost as well as good accuracy over a wide frequency range.

In accordance with one aspect of the present invention there is provided an arrangement and associated technique for calibrating a microcontroller-based spectrum analyzer to overcome the amplitude non-linearity passband problems. The analyzer is automatically calibrated (e.g., at the factory) for amplitude variations under software control. Resulting software-defined calibration parameters are used during system operation to reduce or eliminate passband amplitude errors.

Briefly, a microcontroller in the preferred embodiment provided by the present invention is coupled to a DAC (digital to analog converter) the output of which is used to control the output current (Is) of a current source. The current source output controls the gain of a variable gain intermediate frequency (IF) amplifier.

During factory calibration, a broadband noise spectrum of known constant (over frequency) amplitude is applied to the input of the spectrum analyzer. The microcontroller executes a software routine causing it to step the system incrementally through frequencies in the spectrum of interest and to measure the signal amplitude provided at the output of the IF stages for each incremental frequency. The microcontroller compares the measured signal amplitude with a standard (e.g., software specified) signal amplitude, and adjusts the gain of the variable gain amplifier until the result of the comparison (i.e., the error signal) is zero. The microcontroller stores the associated digital control value applied to the DAC. This stored value is inherently corrected for non-linearity in the DAC, the IF variable gain amplifier, and the current source. The value is stored in non-volatile memory in a gain correction table entry corresponding to the incremental frequency. The analyzer then moves on to a next frequency. At the end of this calibration procedure, the microcontroller has constructed a table of gain correction factors for different operating frequencies.

During normal operation of the spectrum analyzer, the gain correction factor table is accessed each time the spectrum analyzer tunes to a new frequency. The microcontroller applies the amplitude correction factor corresponding to each new frequency (interpolating from gain correction table entries for operating frequencies which do not correspond to table entries) to the DAC so as to adjust the gain of the IF amplifier to correspond to a gain exhibiting a zero error characteristic for that frequency. In this way, amplitude variations due to front end attenuator, IF and detector non-linearities are substantially eliminated.

In accordance with another aspect of the present invention, a phase locked loop is closed to form a closed loop only during calibration (when DAC control values are obtained and stored). During normal operation, the PLL VCO is connected in an open loop circuit with a DAC. This technique of using the PLL in closed loop connection during calibration and operating the VCO in open loop connection in response to values derived by software during calibration achieves nearly the accuracy of closed loop operation while avoiding the penalty of long PLL lock time.

In somewhat more detail, the preferred embodiment uses low-cost DACs (digital-to-analog converters) to control the VCO in an open loop arrangement—even though the low cost DACs themselves introduce additional problems of low resolution and poor linearity. A software calibration routine (and associated components) are provided to calibrate the spectrum analyzer so as to eliminate frequency errors. This calibration routine is performed by the preferred embodiment each time power is initially applied to the spectrum analyzer (and in the preferred embodiment is performed continually between analyzer sweeps to provide on-going automatic calibration).

The microcontroller periodically steps the VCO incrementally through the tuning range using PLL control (i.e., waiting a sufficient time to permit the PLL loop to settle and lock onto each new frequency). For each frequency, an A/D converter coupled to the VCO input samples the VCO input control voltage provided by the loop to the VCO input for each such locked frequency step, and the microcontroller stores the resulting digital value corresponding to the measured control voltage.

After the PLL settles and its phase comparator output is measured for each frequency, the microcontroller applies the stored (possibly scaled) value obtained from the measured VCO control voltage to a DAC. The microcontroller also disconnects the VCO from PLL (phase comparator) control and connects the VCO control voltage input to the output of the DAC. At the same time, the microcontroller monitors the PLL phase comparator output (the PLL still being programmed for the frequency and connected to receive the VCO output), and uses the open loop PLL as a frequency comparator. The microcontroller determines from the PLL phase comparator output whether there is (and the sign of any) error in the frequency output now produced by the VCO under DAC open loop control. The microcontroller adjusts the digital value applied to the DAC (using an iterative binary approximation routine in the preferred embodiment) so as to minimize error between the VCO control voltage applied to the VCO by the PLL and the VCO control voltage applied to the VCO by the DAC.

This process is performed for several frequencies across the spectrum (to reduce "power on" calibration time, the process is not performed for all possible frequency increments in the preferred embodiment, and only a limited number of iterations are performed for each frequency). The resulting frequency calibration (i.e., DAC control) values are recorded in a frequency calibration table stored in memory. During normal operation of the spectrum analyzer, the VCO is operated in an open loop connection and receives its control voltage from the DAC. The microcontroller controls the control voltage provided at the DAC output in response to the values stored in the frequency calibration table, interpolating between stored values where necessary. Meanwhile, the microcontroller continually performs the calibration technique in a piecemeal fashion for as long as the spectrum analyzer is operating (e.g., by adjusting frequency calibration table values between spectrum sweeps, using the PLL in open loop connection as a frequency comparator) so as achieve increased calibration resolution without increasing power on calibration time (and to also permit the analyzer to adapt to changing circuit parameters and drift).

The amplitude and frequency calibration techniques and arrangements discussed above permit the spectrum analyzer to have relatively inexpensive components and circuit arrangements and nevertheless achieve high accuracy. Using the techniques and arrangements provided by the present invention, it becomes possible to provide a spectrum analyzer that is much less expensive than prior art spectrum analyzers which provides accuracy sufficient for most field requirements.

BRIEF DESCRIPTION OF THE DRAWINGS

These and other features and advantages of the present invention will be better and more completely understood by referring to the following detailed description of a presently preferred exemplary embodiment in conjunction with the sheets of drawings, of which:

FIG. 6A is a detailed schematic diagram of the attenuator block 80c shown in FIG. 4;

DETAILED DESCRIPTION OF A PRESENTLY PREFERRED EXEMPLARY EMBODIMENT

Figure 1:
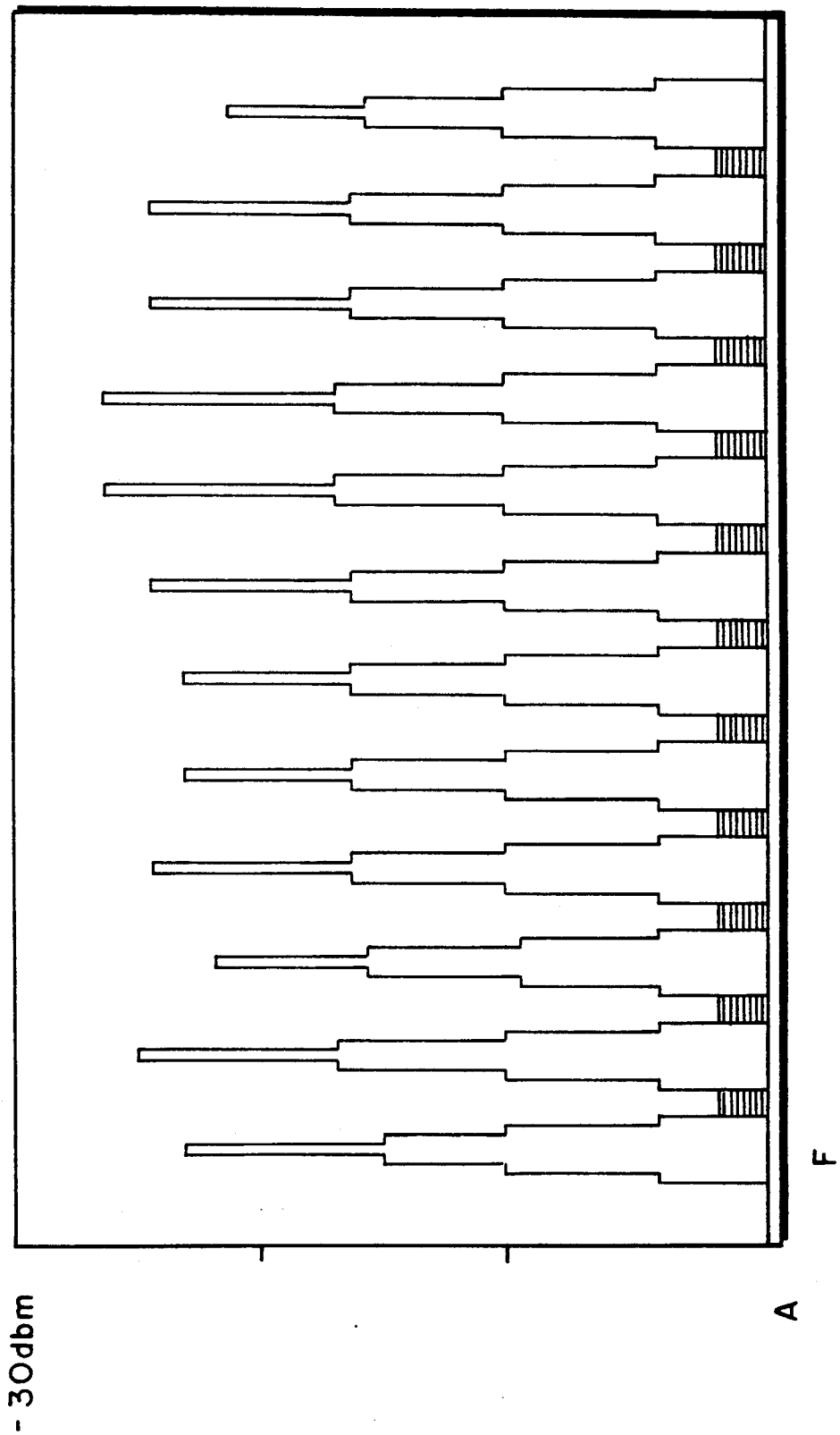
FIG. 1 is an exemplary spectrum analyzer display trace.
Figure 2:
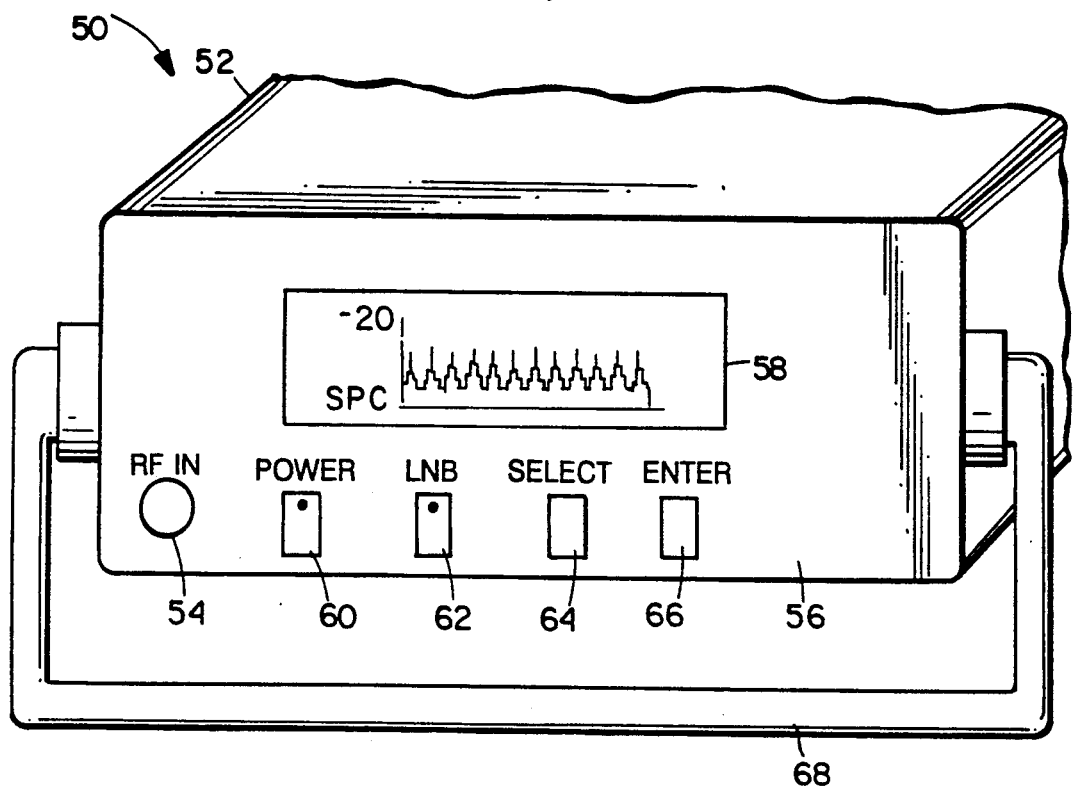
FIGS. 2 and 2A are exterior elevated perspective views of the presently preferred exemplary embodiment in accordance with the present invention.

FIG. 2 is a front elevated perspective view of the exterior of the presently preferred exemplary spectrum analyzer 50 in accordance with the present invention. Spectrum analyzer 50 includes a housing 52 which encases various electronic components (to be discussed in more detail shortly). An RF IN connector 54 (which may be mounted on the front control surface 56 of housing 52) is used to connect spectrum analyzer 50 to an RF input signal to be analyzed. Front control surface 56 in the preferred embodiment also has mounted thereon a graphics display 58 (which in the preferred embodiment comprises a conventional liquid crystal type matrix display) and various user controls 60–66. User controls 60–66 in the preferred embodiment include a power switch 60, an LNB switch 62, a select switch 64 and an enter switch 66. The select and enter switches 64,66 are used in conjunction with display 58 to display various user-programmable options (e.g., operating modes), and to permit the user to select different operating parameters (such as front end attenuation, frequency range, etc.).

Figure 2A:
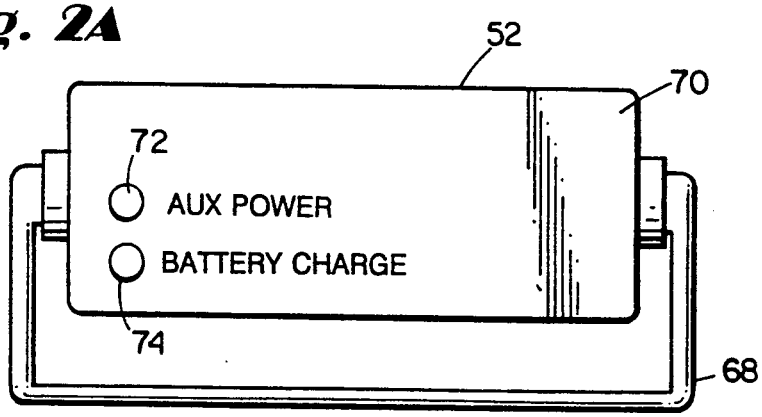

Housing 52 in the preferred embodiment is small enough to be portable and handheld, and includes a carrying handle 68 for use in carrying the housing (and also elevating control surface 56 to make it more easily accessible to the user). Housing 52 also includes (as shown in FIG. 2A) a rear panel 70 which, in the preferred embodiment, provides connectors 72,74 for an auxiliary power supply and for a battery charger, respectively.

Figure 3:
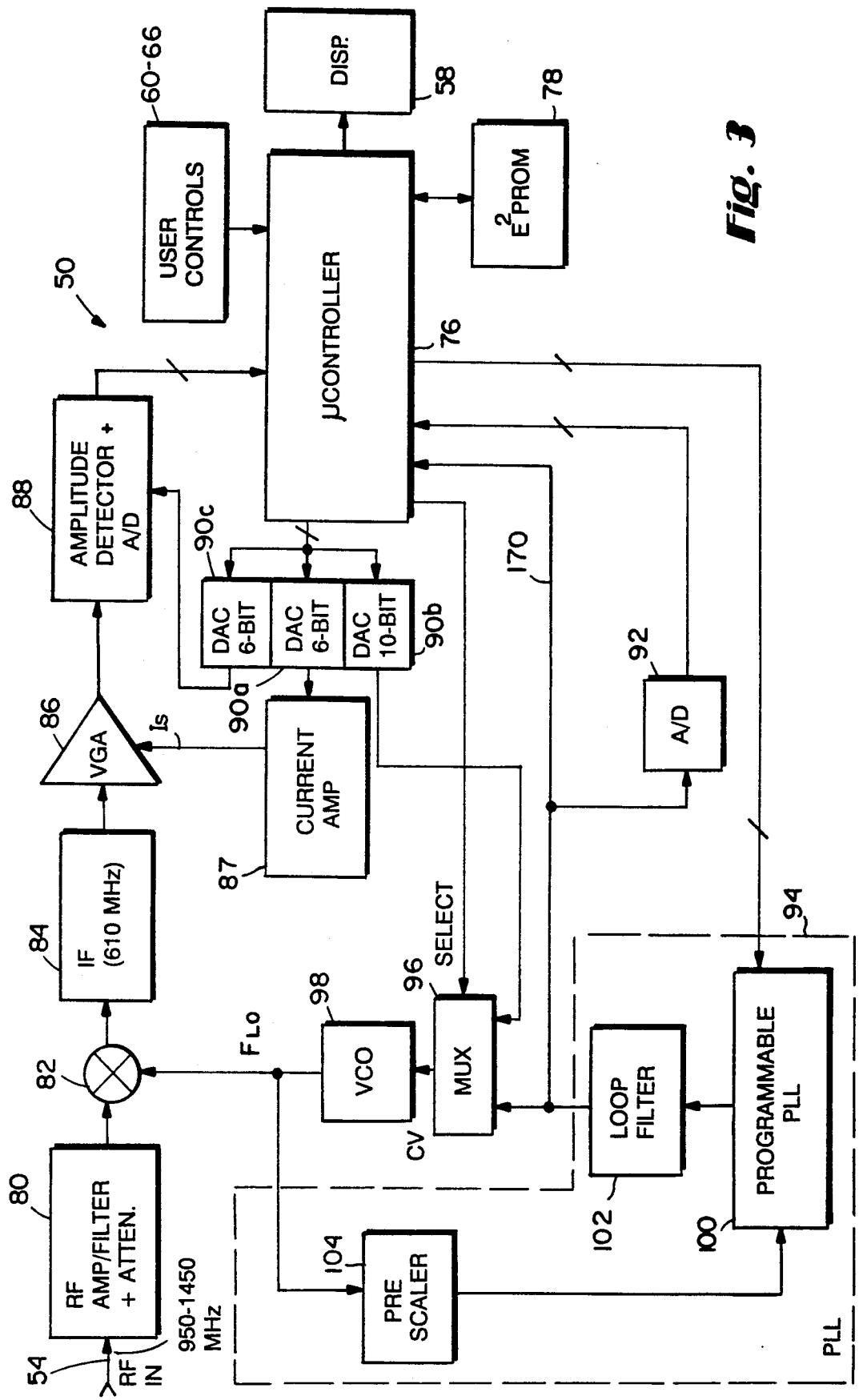
FIG. 3 is a high-level block diagram of the architecture of the preferred embodiment spectrum analyzer.

FIG. 3 is a high-level schematic block diagram of spectrum analyzer 50. The "brain" of spectrum analyzer 50 is a conventional microcontroller 76 which coordinates all of the operations of the spectrum analyzer under software control. For example, microcontroller receives user inputs from user controls 60–66, and controls display 58 to generate display outputs. Microcontroller 76 is also intimately involved in controlling the RF components of spectrum analyzer 50, as will be explained.

Spectrum analyzer 50 further includes an RF amplifier/filter and attenuator 80 (the so-called "front end" of the spectrum analyzer), a mixer 82, an intermediate frequency (IF) amplifier circuit 84 (which includes amplifiers and mechanical filters), a variable gain amplifier (VGA) 86, an amplitude detector and A/D converter 88, dual digital/analog converters 90A,90B, an analog/digital converter 92, a phase lock loop circuit 94, an analog multiplexer 96, and a voltage controlled oscillator (VCO) 98. In the preferred embodiment, PLL circuit 94 includes a standard off-the-shelf single chip microcontroller-compatible PLL 100 (Motorola Part No. 145145P), a loop filter 102, and a prescaler 104. PLL chip 100 in the preferred embodiment includes a conventional programmable digital divider network (e.g., comprised of programmable counters and registers), in addition to a phase comparator circuit. The output of the phase comparator within PLL chip 100 is applied to loop filter 102. Prescaler 104 provides an additional division factor to permit a relatively low reference frequency to be used to drive PLL 94. In the preferred embodiment, this reference frequency is 62.5 kHz (provided an external crystal controlled clock oscillator not shown in FIG. 3), and the output frequency of the VCO 98 ranges from 1570 through 2050 MHz in four MHz steps.

VCO 98 in the preferred embodiment acts as the local oscillator for spectrum analyzer 50, which includes a single conversion superheterodyne RF receiver. RF input signals applied to RF IN 54 are filtered and attenuated by front end 80 before being applied to one input of a mixer 82. The output $F_{LO}$ of VCO 98 is applied to the other input of this mixer 82. The heterodyned output of mixer 82 (i.e., the sum of the difference of the incoming RF signals and the local oscillator signal $F_{LO}$) is filtered and amplified by IF amplifier 84. In the preferred embodiment, IF amplifier 84 has a center frequency of 610 MHz, and the local oscillator signals $F_{LO}$ varies between 1570 MHz and 2050 MHz (the IF amp thus selects the difference between the RF input signals and the local oscillator signal). As in any conventional superheterodyne RF receiver, different RF signals are centered within the passband of IF amplifier 84 by changing the frequency of local oscillator signal $F_{LO}$.

The output of IF amplifier 84 is applied to the input of a variable gain amplifier 86. Variable gain amplifier VGA 86 is controlled by the output of current amplifier 87. Current amplifier 87, in turn, has an output current controlled by microcontroller 76 via DAC 98. Microcontroller 26 thus is capable of altering, under software control, the overall gain applied to incoming RF signals merely by writing different values to DAC 90a.

The output of VGA 86 is applied to the input of a detector 88, detector 88 includes an analog-to-digital converter (as well as other components), and provides a digital output signal to microcontroller 76—this digital output signal indicating the amplitude of the RF signal currently selected by current local oscillator $F_{LO}$. Since microcontroller 76 controls the frequency of local oscillator signal $F_{LO}$, it can ascertain the amplitude of any RF signal having a frequency within the range of spectrum analyzer 50.

Typically, spectrum analyzer 50 may be operated in a so-called "sweep" mode in which it samples the amplitudes of RF signals at many discrete frequencies within the 950–1450 MHz range and then provides a composite display of the results (i.e., a bar graph or line or point plot) on the display). Such "sweep" mode operation generally occurs relatively rapidly (e.g., four sweeps per second) sampling of all frequencies that are to be included on the display, and may sample many different frequencies of interest for each sweep. For example, it may be desirable to sample the amplitudes of all twenty-four C band satellite transponders; or the user may desire more continuous type spectrum sweep (in which case, spectrum analyzer 50 may sample its entire RF range in relatively small steps such as 5 MHz). Microcontroller 76 may display a line plot or a bar graph on display 58 in response to each set of frequency samples it acquires.

It will be understood by those skilled in this art that RF amplifier/filter and attenuator block 80 (and possibly to a lesser extent, mixer 82) will not exhibit perfectly uniform frequency response over the entire C band range of 950–1450 MHz. The frequency response of these stages may be accentuated, for example, at the lower end of the frequency range as compared with the upper end, and may also exhibit frequency response anomalies for particular frequencies. Rather than providing precision RF amplifier and mixing stages in an attempt to minimize such frequency response variations, the preferred embodiment of the present invention simple corrects for such frequency response variations under software control.

Each time spectrum analyzer 50 tunes to a different RF frequency, microcontroller 76 applies a different digital value to DAC 90a (thus changing the gain of VGA 86). Microcontroller 76 thus controls the gain of VGA 86 as a function of the frequency of local oscillator signal $F_{LO}$ using prestored digital values contained within ROM 78. In the preferred embodiment, microcontroller 76 determines these prestored digital values during a calibration procedure (in the preferred embodiment, this calibration procedure is performed at the factory and is hence termed "factory calibration"). Such factory calibration requires a broadband "white noise" RF source of known constant output level to be applied to the RF IN connection 54, and selection (e.g., by connecting a jumper) of the factory calibration routine for performance by microcontroller 76. The microcontroller 76 uses for factory calibration the very same components (DAC 90a, current amplifier 87, VGA 86, and amplitude detector and A/D converter 88) it uses during normal operation to correct for amplitude variations and to measure incoming signal amplitudes.

Briefly, microcontroller 76, when operating in the factory calibration mode, tunes PLL 94 to a desired frequency within the spectrum analyzer range and then varies the gain of VGA 86 until the microcontroller detects the signal amplitude corresponding to a preprogrammed value (e.g., −30dBm). Microcontroller 76 stores the digital value it had to apply to DAC 90a in order to obtain this standard amplitude indication, and then repeats this process for several frequencies (e.g., 24) spaced equally (in the preferred embodiment) across the spectrum analyzer frequency range. The resulting amplitude correction lookup table of DAC 90a control values verses local oscillator frequencies is stored in ROM 78, and is later accessed by microcontroller 76 during operation in a normal mode.

Each time, during normal mode operation, microcontroller 76 changes the local oscillator frequency $F_{LO}$, it references this gain correction lookup table in order to determine what gain should be provided by VGA 86 for that particular frequency. Microcontroller 76 provides a linear interpolation calculation (if necessary) to determine appropriate VGA 86 gain settings for frequencies between those recorded in the gain correction table.

Another significant technical feature of the preferred embodiment spectrum analyzer design shown in FIG. 3 is the presence of MUX 96 and the selection it performs between the output of filter 102 and the output of DAC 90b. MUX 96 alternatively selects the output of PLL loop filter 102 and the output of DAC 90b for application to the input of VCO 98. Assuming MUX 96 selects the output of loop filter 102, PLL 94 is configured as a standard closed-loop phase lock loop, with the phase comparator output by PLL chip 100 being filtered by loop filter 102 and then used to control the local oscillator output frequency $F_{LO}$ available at the output of VCO 98 If MUX selects the output of DAC 90b for controlling VCO 98, on the other hand, the VCO is operated in open loop connection and the output of the DAC directly controls the local oscillator output frequency $F_{LO}$.

MUX 96 is thus capable of (under control of microcontroller 76) of selecting between DAC 90b and loop filter 102 as a source of the control voltage CV for VCO local oscillator 98. In the preferred embodiment, PLL 94 is used only for calibration purposes and does not control VCO 98 during normal operating modes of spectrum analyzer 50. Rather, during such norm 1 operating modes, microcontroller 76 causes MUX 96 to select the output of DAC 90b in lieu of the output of PLL loop filter 102 for application to the control input of VCO 98.

Microcontroller 76 produces the CV control voltage during normal operation by simply applying appropriate digital value to the input of DAC 90b. Of course, determining what DAC input value is "appropriate" for generating a particular desired local oscillator frequency $F_{LO}$ is not a trivial matter. Microcontroller 76 uses PLL 94 and A/D converter 92 when operating in a frequency calibration mode to determine digital control values for application to DAC 90b to achieve desired frequency operation. The steps performed by microcontroller 76 under program control to generate such DAC 90b control values will be discussed in connection with FIGS. 7A–7B. Briefly, however, in the following procedure is performed for each of several frequencies across the spectrum analyzer operating range in order to provide frequency calibration values:

- microcontroller 76 controls MUX 96 to connect VCO 98 in closed loop connection with PLL 94;
- the microcontroller writes programming data to PLL chip 100 specifying a desired frequency;
- the microcontroller waits for PLL 94 and VCO 98 to settle and "lock on" to the desired $F_{LO}$ local oscillator frequency (since PLL 94 provides a relatively accurate frequency output, the local oscillator signal $F_{LO}$ is extremely close to the desired frequency within a small tolerance);
- the microcontroller samples the CV control voltage output produced by PLL 94 using A/D converter 92 and stores the sample value;
- the microcontroller scales the read in value to make it appropriate for controlling DAC 90b, and writes the scaled value to the DAC;
- the microcontroller controls the MUX to select the DAC output instead of the PLL output;
- the microcontroller monitors the direct output of PLL loop filter 102 (available on line 170) —using the PLL in an open loop connection as a frequency comparator to determine whether the $F_{LO}$ local oscillator frequency produced by VCO 98 under DAC control is higher or lower than the frequency it produced under the closed loop PLL control; and the microcontroller adjusts the control value being applied to the DAC while monitoring the PLL output signal on line 170 to reduce the frequency error.

Thus, PLL 94 is used in closed loop mode in the preferred embodiment to provide an accurate VCO control voltage CV merely so that the microcontroller 76 can measure that control voltage. PLL 94 is subsequently used in open loop connection (i.e. disconnected from the control voltage input of VCO 98) as a frequency comparator —thus permitting microcontroller 76 to ascertain the nature (i.e. the direction) of the frequency error between what the PLL has been programmed to produce and what the VCO actually produces in response to control voltage provided to it by VCO 90b. As mentioned above, this feature of the preferred embodiment permits spectrum analyzer 50 to use relatively rapidly responding open loop control for local oscillator frequency selection and yet provide nearly the accuracy available using PLL closed loop control.

Figure 4:
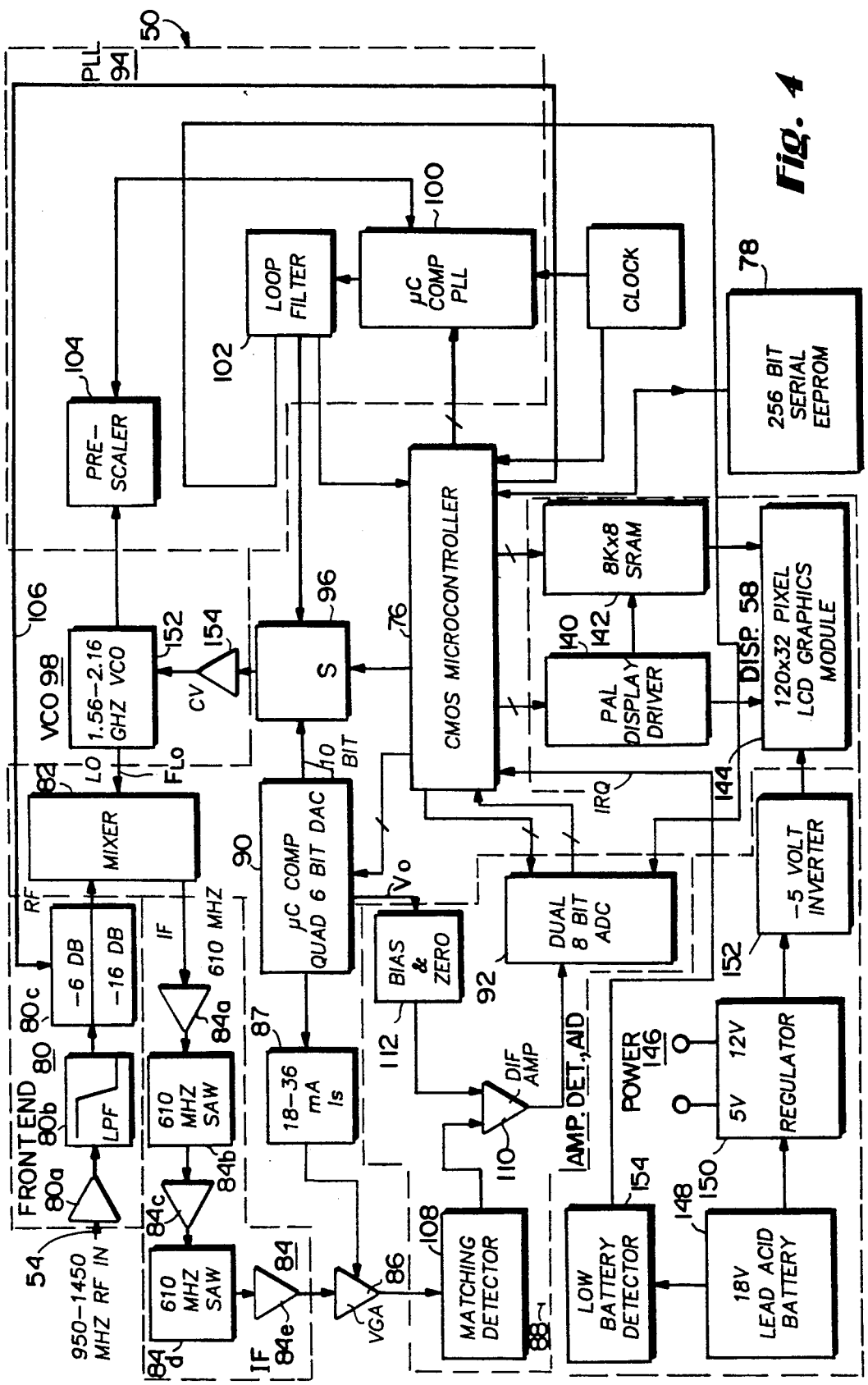
FIG. 4 is a more detailed block diagram of the preferred embodiment spectrum analyzer architecture.

FIG. 4 is a somewhat more detailed schematic block diagram of spectrum analyzer 50. As shown in FIG. 4, front end 80 includes an input RF amplifier 80a, a low-pass filter 80b, and a selectable attenuator circuit 80c. Attenuator 80c in the preferred embodiment applies of one of two attenuation factors (minus 6dBm or minus 16dBm) in response to a control signal provided on control line 106 by microcontroller 76. Intermediate frequency amplifier 84 includes several cascaded amplifiers (84a,84c,84e) alternating with SAW type mechanical filters (84b,84d). Filters 84b,84d provide relatively good out-of-band signal rejection so as to provide high selectivity of RF signals to which spectrum analyzer 50 is tuned.

Amplitude detector block 88 in the preferred embodiment includes a matching detector 108, a differential amplifier 110, a bias and zeroing circuit 112 and one half of dual 8-bit A/D converter 92. Matching detector 108b in the preferred embodiment comprises a standard biased diode type detector design which produces a DC voltage level responsive to the amplitude of signals outputted by VGA 86 and which also include a DC offset component which may vary with temperature and other factors. Microcontroller 76 is capable of cancelling this DC offset by applying a digital value to DAC 90c (in the preferred embodiment, all three of DACs 90 are contained in a single quad 6-bit DAC integrated circuit, with DAC 90b using two of the four DACs (see FIG. 5) in order in increase resolution to ten bits). DAC 90c produces a voltage $V_o$ which it applies to bias and zero circuit 112. Bias and zero circuit 112 in turn produces a further voltage output level to one input of differential amplifier 110, with the other input of this differential amplifier being connected to receive the output of detector 108. Differential amplifier 110 subtracts the voltage level produced by bias and zero circuit 112 from the input of matching detector 108—thus subtracting the DC bias level from the output of the detector. The output of differential amplifier 110 is converted into a digital value by A/D converter 92 and applied to microcontroller 76 in digital form.

Figure 5:
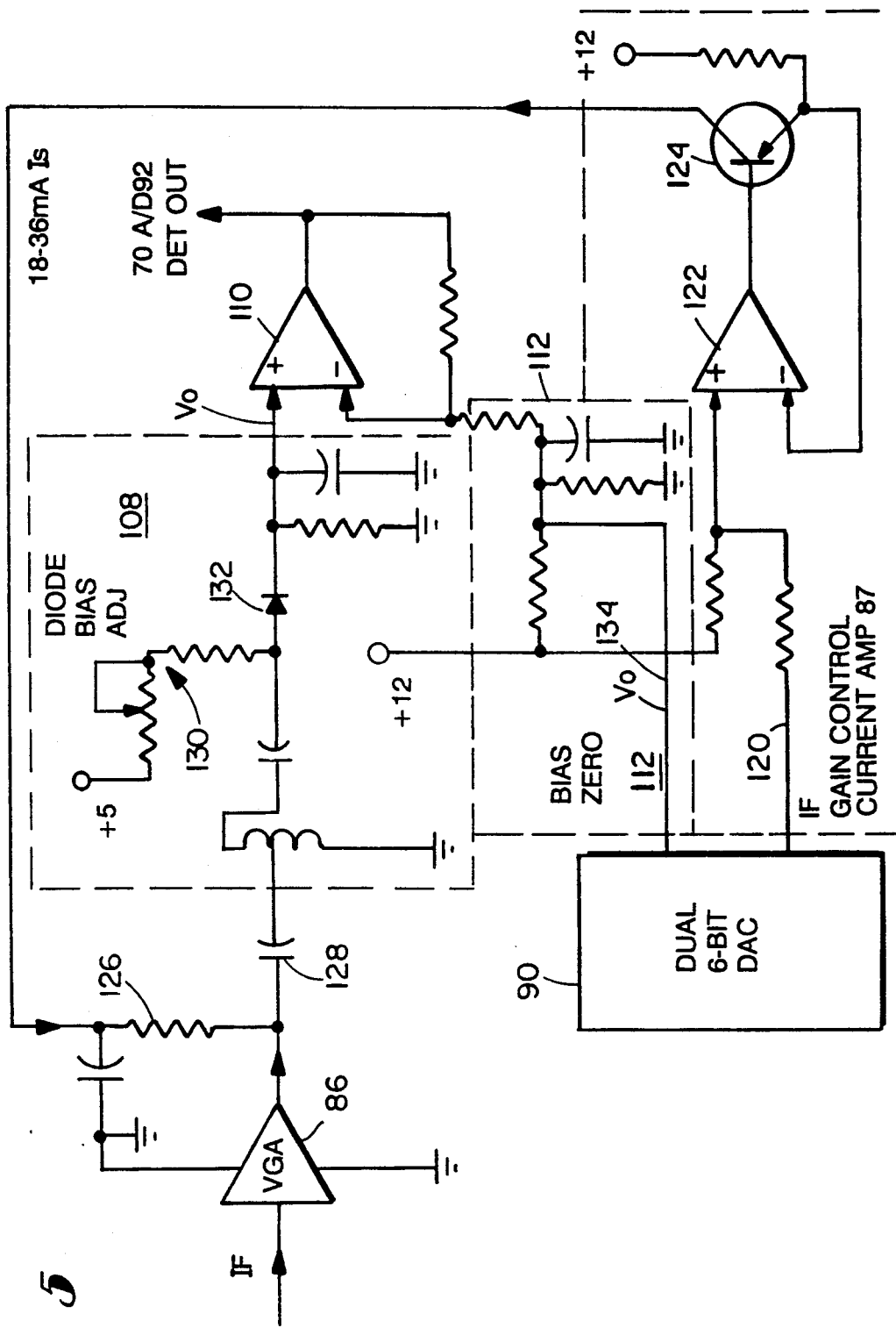
FIG. 5 is a detailed schematic block diagram of the variable gain amplifier and amplitude detector blocks shown in FIG. 4.

FIG. 5 is a detailed schematic diagram of the VGA 86, matching detector 108, differential amplifier 110, bias and zero circuit 112 and current amplifier 87 of the preferred embodiment. Output 120 of DAC 90 is applied to a resistor network to an operational amplifier 122, the op band output controlling the amount of current $I_s$ which is passed by a transistor 124 (in the preferred embodiment, this current can range from 18mA to 36mA). This output current $I_s$ is applied via a resistor 126 to vary the voltage gain of VGA 86. The output of VGA 86 is coupled to matching detector 108 via a series capacitor 128. A diode bias network 130 within detector block 108 apprise a forward bias to a detector diode 132—thus causing the voltage available at the cathode of diode 132 to vary in response to the amplitude of RF signal present at the output of VGA 86. This diode output voltage is applied to the non-inverting input of the differential amplifier 110. The inverting input of differential amplifier 110 receives the $V_o$ voltage output of DAC 90 (on line 134 after this $V_o$ voltage has passed through an RC network as shown in block 112. Differential amplifier 110 subtracts the $V_o$ voltage from the $V_d$ detected voltage provided at the output of diode 132, and provides a resulting detector output voltage to A/D converter 92 for conversion into digital form.

Referring once again to FIG. 4, display 58 includes the PAL display driver 140 of conventional design, scratch pad RAM 142, and a conventional 120x32 pixel LCD graphics display module 144 of conventional design. Spectrum analyzer 50 also includes a power section 146, which in the preferred embodiment comprises an 18v lead acid battery 148 which is regulated down by a regulator 150 to provide +5 VDC and +12 VDC voltages for driving the remainder of the spectrum analyzer components. The −5v converter 152 is also included to provide low current −5 VDC as required by the LDC graphics module 144. Low battery detector circuit 154 of conventional design monitors the output of lead acid battery 148 and interrupts microcontroller 76 whenever low battery voltage is detected. Auxiliary power 72 and battery charge 74 connections (not shown in FIG. 4) provide the capability to recharge battery 148 from outside of housing 52 and to substitute externally applied power (e.g., from a 110 VAC adapter) for the voltage produced by the battery.

Figure 6:
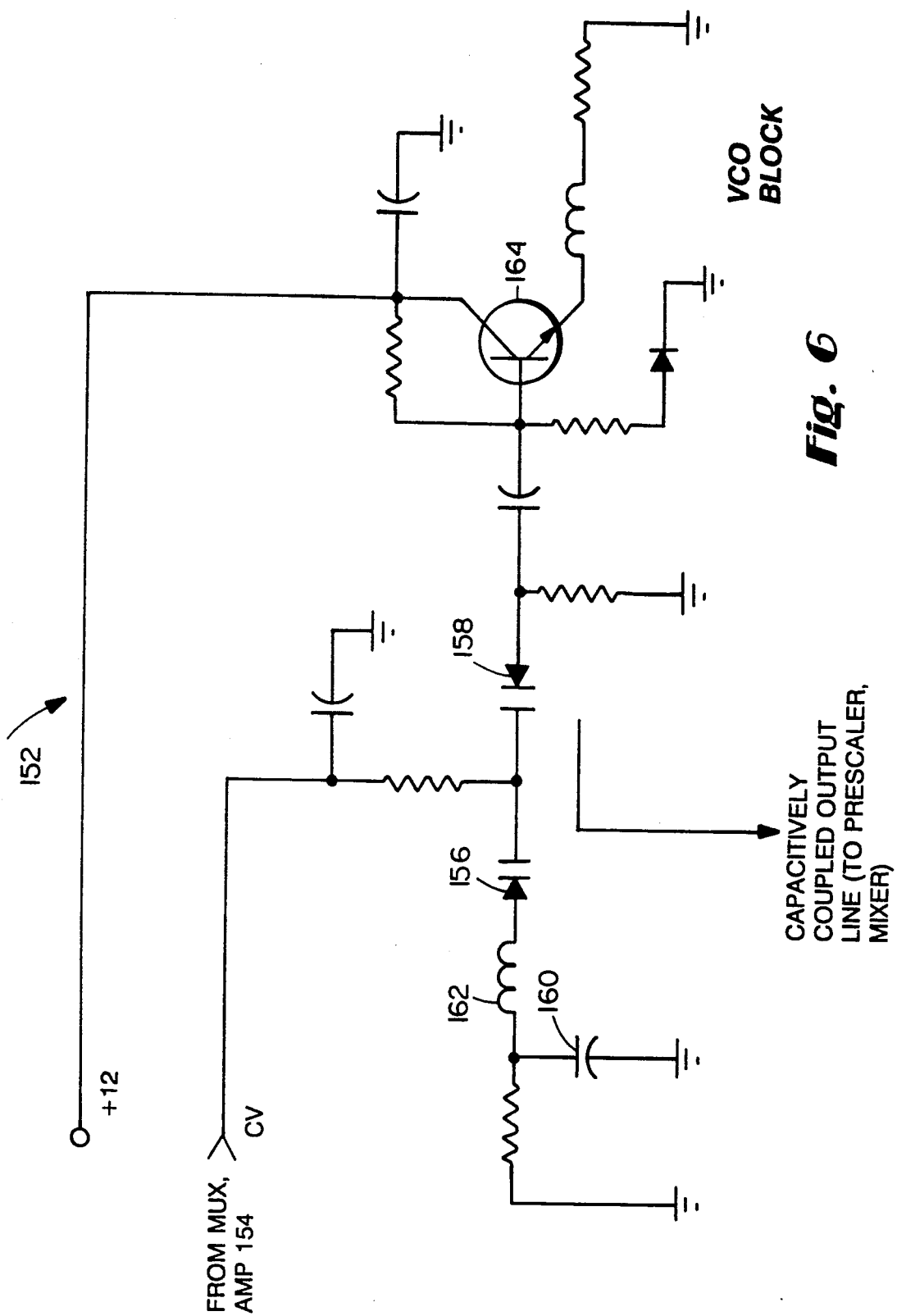
FIG. 6 is a detailed schematic diagram of the VCO block shown in FIG. 4.

VCO 98 as shown in FIG. 4 includes a 1.56–2.16 GHz voltage control oscillator circuit 152 and a control voltage amplifier 154. FIG. 6 is a schematic diagram of VCO circuit 152. Control voltage CV provided at the output of amplifier 154 is used to vary the capacitance of a pair of varactors 156,158. Varactors 156,158 are connected as part of a smaller PI network CLC resident tank circuit including capacitor 160 and inductor 162. This residence circuit is, in turn, coupled to the base of a high-frequency 164. Transistor 164 is connected in a standard oscillator circuit configuration, and oscillates in a free running manner (with the frequency of oscillation being dependent in part on the capacitances provided by varactors 156,158). In the preferred embodiment, VCO circuit 152 has a frequency range of about 1.57–2.05 MHz as controlled by the CV control voltage. Amplifier 154 shown in FIG. 4 is provided to scale to 0–5 VDC voltage range to an appropriate voltage range (e.g., 0–15 VDC) such that VCO 152 has a frequency range of on the order of 500 MHz.

FIG. 6A is a detailed schematic diagram of an exemplary attenuator block 80c shown in FIG. 4. Attenuator block 80c in the preferred embodiment includes two attenuator networks 190,192, each independently connectable in line by the microcomputer 76 (via control lines 106a,106b, respectively). The exemplary attenuator shown uses PIN diodes 194 as switching elements and conventional "T" pad resister networks 196 to provide attenuation. Microcontroller 76 corrects one, the other, or neither attenuator in line by controlling lines 106a,106b (disconnecting both attenuators effectively disconnects RF IN 54).

Figure 7A:
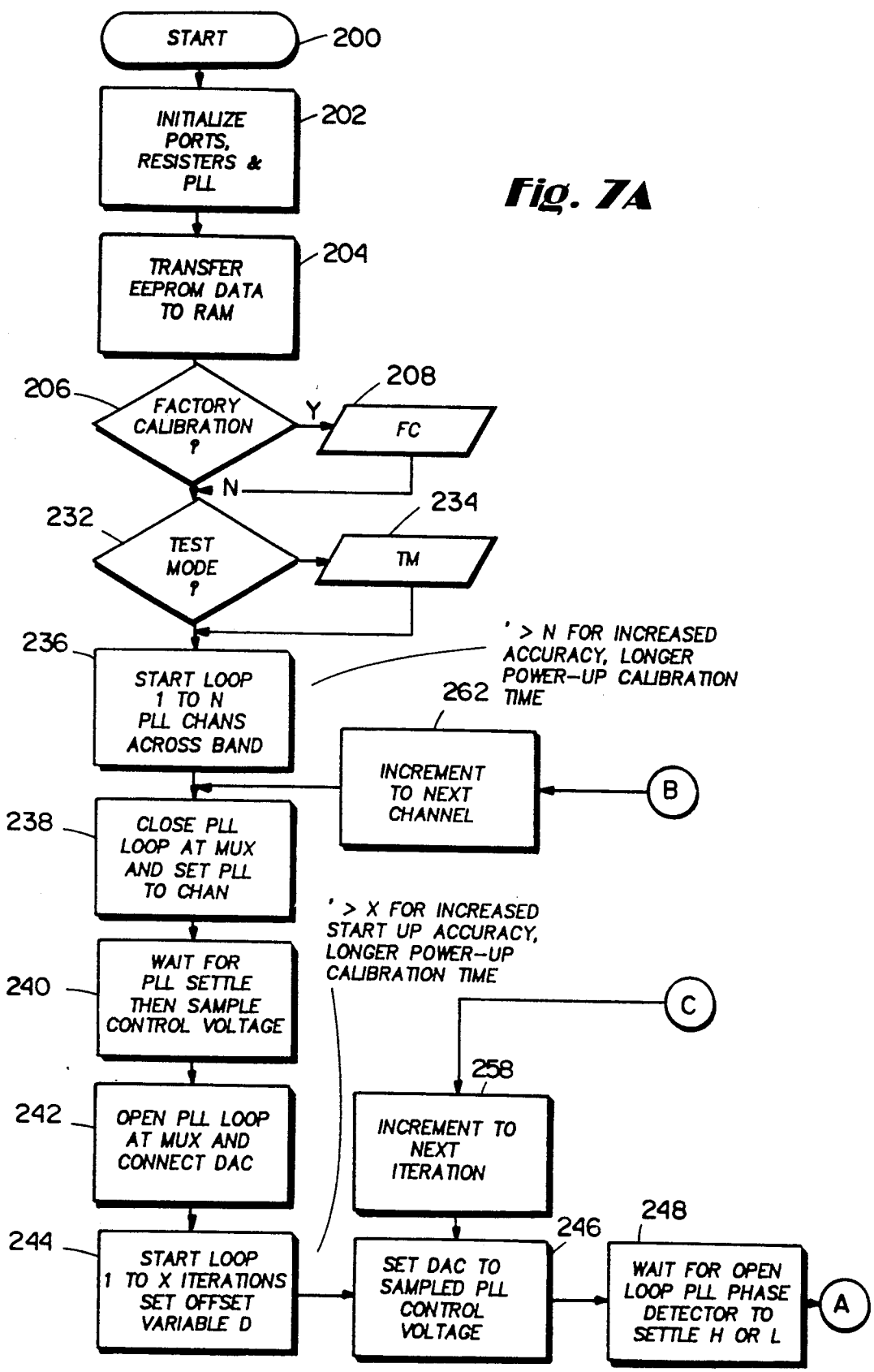
FIGS. 7A, 7B and 8 are schematic flow charts of exemplary program control steps performed by the preferred embodiment spectrum analyzer.
Figure 7B:
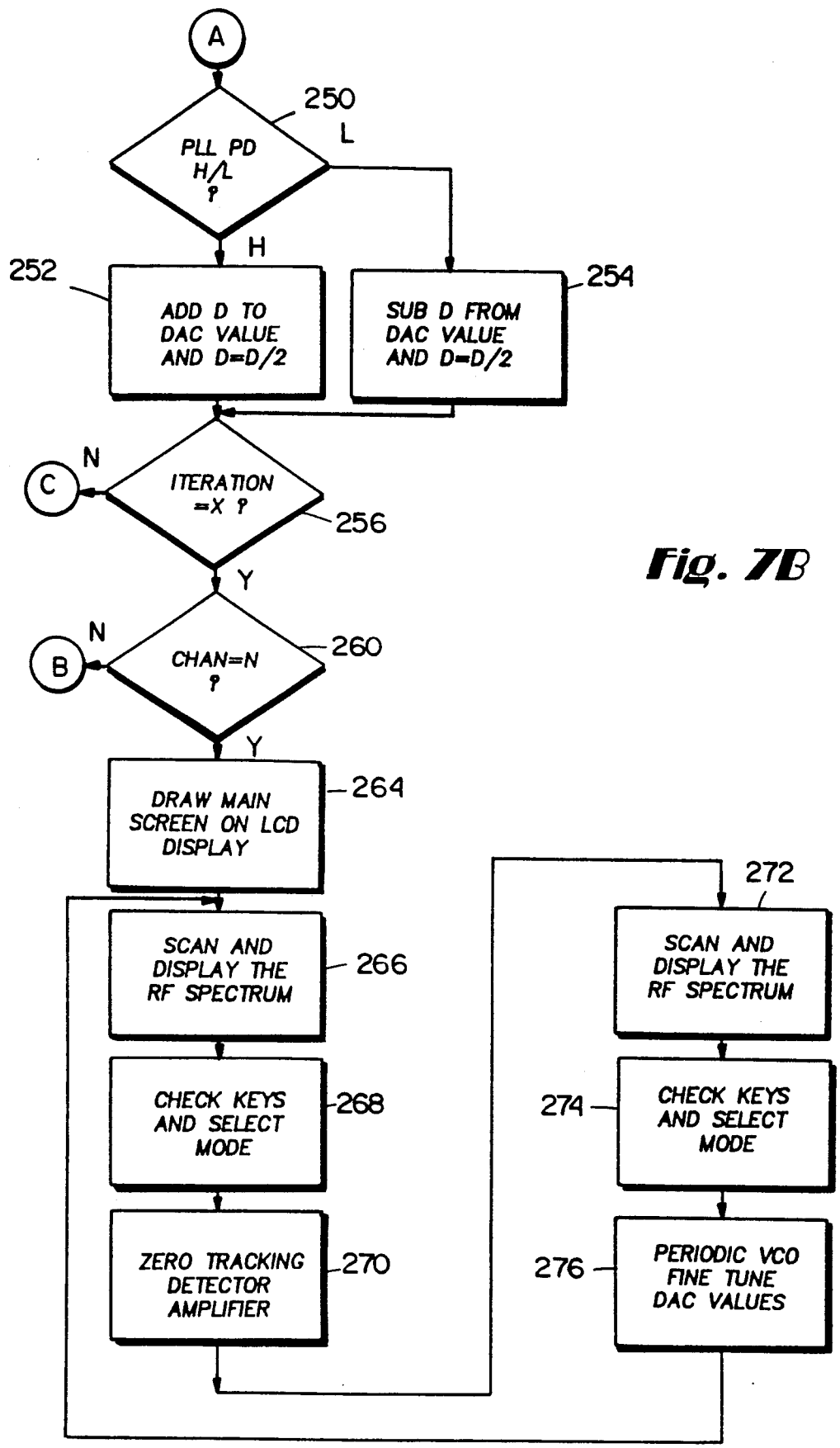
Figure 8:
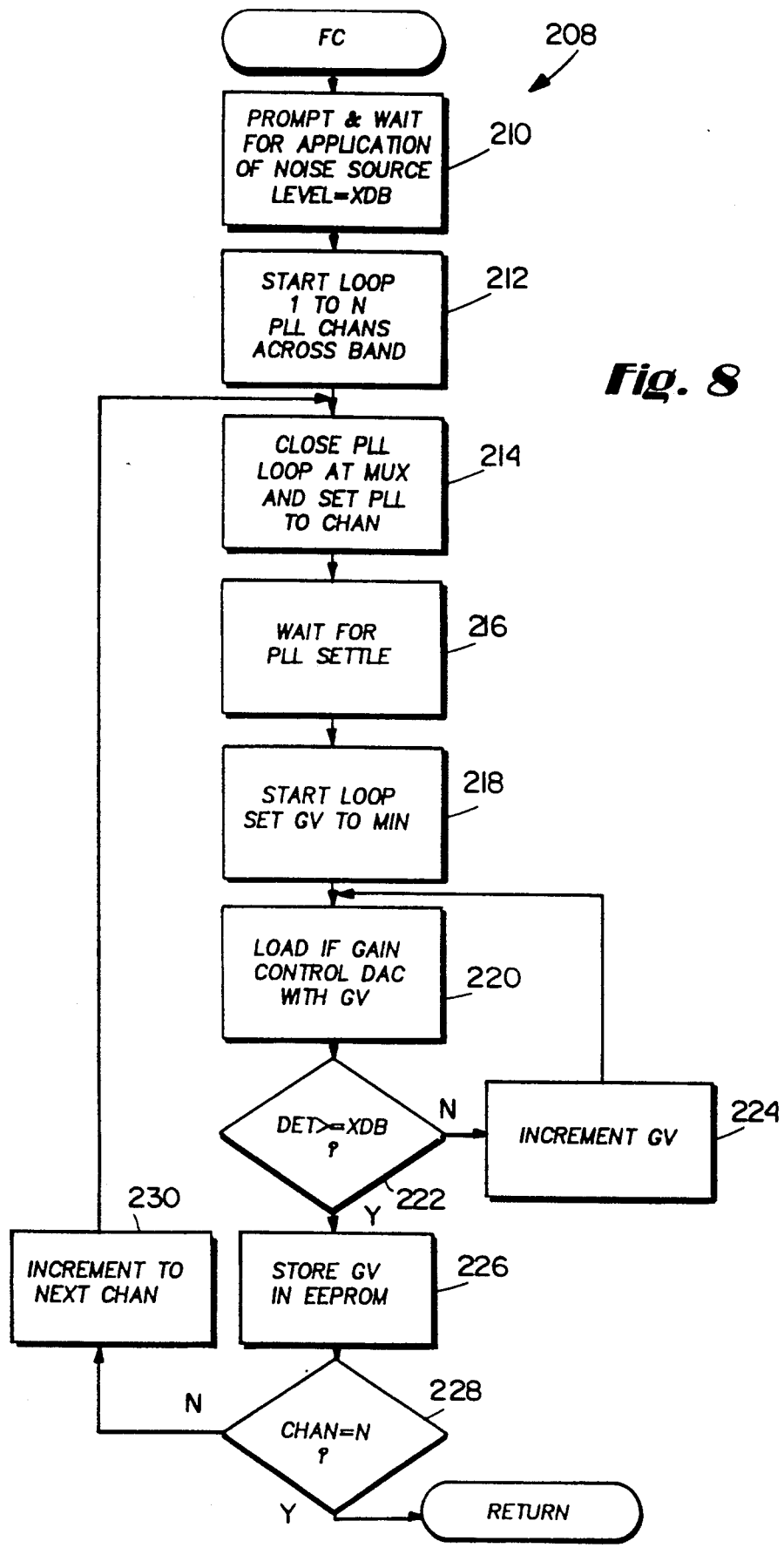
Figure 9:
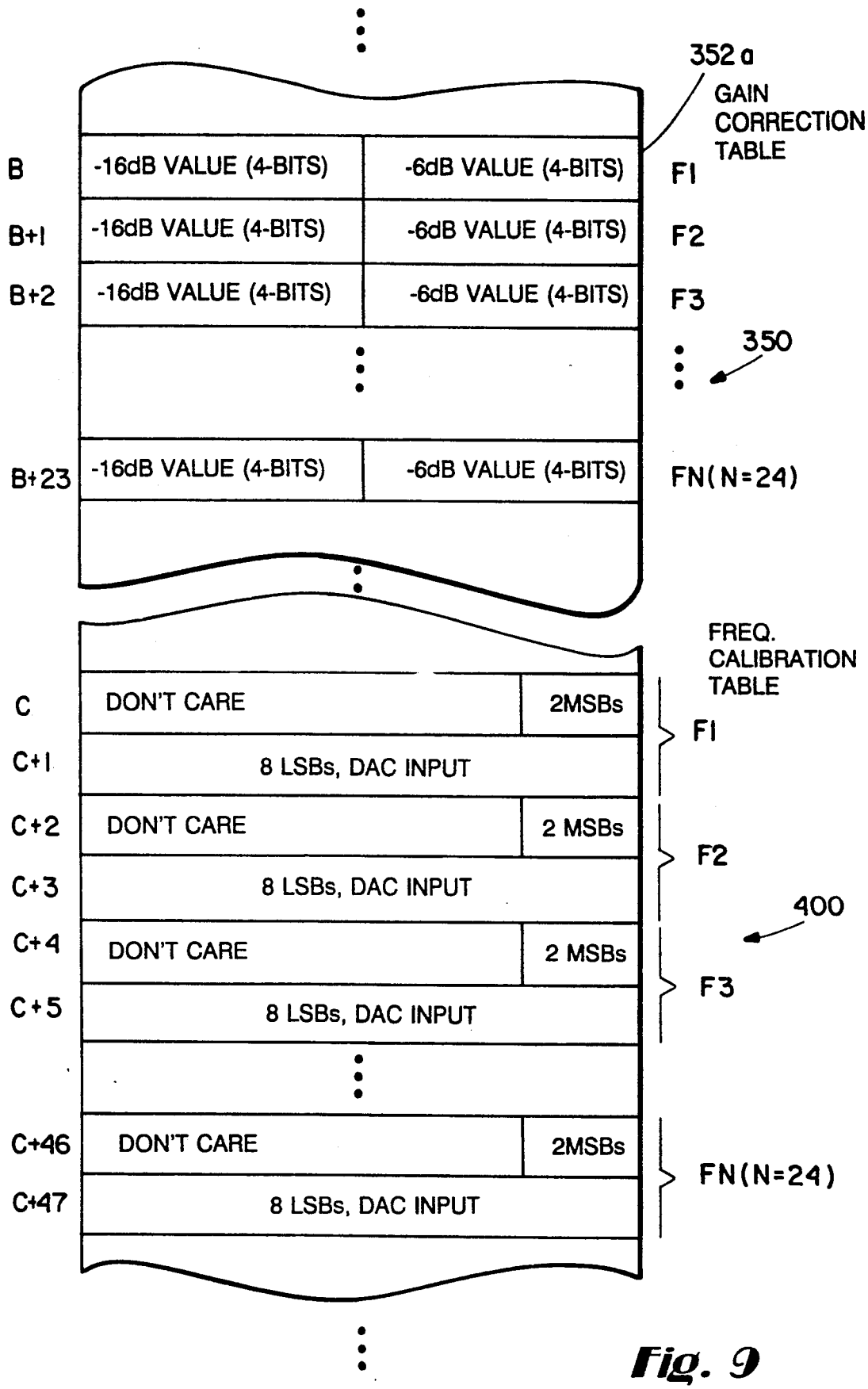
FIG. 9 is a schematic diagram of exemplary data structures maintained by the preferred embodiment spectrum analyzer.

FIGS. 7A, 7B and 8 are schematic flow charts of exemplary program control steps performed by microcontroller 76 in the preferred embodiment, and FIG. 9 is a schematic diagram of exemplary gain correction table and frequency calibration tables data structures maintained in memory by the microcontroller FIGS. 7A-7B illustrate the spectrum analyzer's "main" routine (which includes frequency calibration steps), while FIG. 8 is a flow chart showing the spectrum analyzer gain correction "factory calibration" routine.

Referring to FIG. 7A, upon powerup (block 200) the spectrum analyzer microcontroller 76 initializes all ports and registers, and also initializes PLL chip 100 (block 202). Microcontroller 76 then transfers data from non-volatile external EEPROM 78 to internal random access memory (RAM) (block 204). In the preferred embodiment, a serial EEPROM 78 is provided for storing various parameters such as the gain correction table shown in FIG. 9. The program instructions are maintained within a further non-volatile ROM within microcontroller 76.

Microcontroller 76 next determines whether factory calibration is invoked (e.g., by testing the logic state of a hardware pin; decision block 206). In the preferred embodiment, the factory calibration routine is generally performed only at the factory before housing 52 has been closed—thus it is convenient to simply provide an additional connection to on of microcontroller pins at that time. If factory calibration is invoked, microcontroller 76 begins executing a factory calibration routine 208 shown in more detail in FIG. 8. Referring now to FIG. 8, as part of the factory calibration routine, microcontroller 76 first generates a prompt on display 58 requesting the technician to apply a constant noise source at a predetermined level (e.g., −30dBm) to the RFN connection 54, and then waits for the technician to depress one of user controls 62-66 (block 210). In the preferred embodiment, microcontroller 76 then generates a further message on display 58 indicating that gain control compensation is occurring, and enters an outside gain compensation loop at block 212. This outside gain compensation loop is performed once for each of plural different frequencies (e.g., twenty-four in the preferred embodiment) in order to generate a gain correction factor at various frequencies across the spectrum analyzer range.

Microcontroller 76 then controls MUX 96 to select the output of loop filter 102 (thus closing the PLL) and writes desired frequency information to PLL chip 100 (block 214). Microcontroller 76 then waits a short time period (e.g., 50 ms) to allow PLL 94 to settle and thus to "lock on" to the desired frequency (block 216). Microcontroller 76 at this time also controls attenuator 80c to select one of two of the attenuating factors the attenuator provides (not shown). Microcontroller 76 then begins executing an inner loop at block 218, and sets an internal gain value to a minimum setting (block 218). Microcontroller 76 writes this gain control value to DAC 90a (block 220), and then determines whether the output of amplitude detector 88 corresponds to the preset value (e.g., −30dBm) (block 222). If the detected amplitude is less than the standard expected amplitude, microcontroller 76 increments its internal GV value (block 224) and repeats blocks 220, 222. In the preferred embodiment, microcontroller 76 simply increments this GV value iteratively until the detected value is just equal to or exceeds the expected value (if desired, a binary approximation or other technique could be used to determine the appropriate set point). Once the appropriate set point is located by decision block 222, microcontroller 76 stores the set point in non-volatile memory 78 (block 226). Although not shown in the FIG. 8 flowchart, the preferred embodiment repeats the loop of blocks 218-226 captures switching the attenuation of attenuator 80c such that two different gain correction factors (one for each of the two possible attenuator settings) provided for each frequency. Dual gain correction factors are generated because the attenuator itself 80c may introduce different frequency-dependent amplitude variations depending upon which attenuation setting is employed.

Microcontroller 76 then determines whether gain correction factors have been determined for a sufficient number of frequencies (decision block 228). If not, microcontroller 76 moves to the next frequency (for the purposes of this factory calibration routine, gain correction factors are determined for twenty-four different frequencies equally spaced across the spectrum analyzer range) (block 230), and repeats the steps of blocks 214-230 for the next (and all successive) frequencies for which gain correction factors are to be stored.

FIG. 9 is a schematic diagram of exemplary portions of the memory of microcontroller 76, and shows an exemplary data structure format for a gain correction table 350 generated by factory calibration routine 208. In the preferred embodiment, gain correction table 350 includes twenty-four 8-bit words, one word for each of twenty-four different frequencies. In the preferred embodiment, these frequencies are spaced evenly across the spectrum analyzer frequency range (frequency spacing is about four times the minimum frequency increment provided by PLL 94) and coincide with C-band satellite transponder frequencies (for reasons of convenience).

The word 352 are stored in ascending frequency order in the preferred embodiment, and do not contain explicit frequency reference information (but rather are simply later indexed by microcontroller 76 according to frequency so as to minimize storage requirements). Each word 352 provides two 4-bit gain correction factors: a first 4-bit gain correction factor corresponding to a −16dB attenuation of attenuator 80c is stored in the upper 4-bit nybble of the word, and the lower 4-bit nybble stores a further 4-bit gain correction factor corresponding to a −6dB setting of the attenuator. Using this exemplary data structure, microcontroller 76 is able to index words 352 based on frequency alone, and to then select the upper or lower nybble of the indexed word depending upon the current attenuator setting.

Referring once again to FIG. 7A, if factory calibration is not selected (or upon the completion of factory calibration), microcontroller 76 determines whether a test mode is called for (decision block 232). The test mode, which may be invoked by a user, tests various portions of spectrum analyzer 50 (e.g., memory, the PLL, etc.) and thus provides diagnostic information for use in checking out or repairing spectrum analyzer (block 234). Assuming the test mode is not invoked, spectrum analyzer 50 then begins performing the frequency calibration routine of blocks 236-260. This frequency calibration routine is performed every time the preferred embodiment spectrum analyzer 50 is powered on.

Before performing the frequency calibration routine, however microcontroller 76 makes adjustments to cancel the bias of detector 88 (e.g., by disconnecting incoming signals from the input of detector 100 using attenuator 80c (e.g., by disconnecting both attenuator networks 190,192), and by then varying the output of DAC 90 until the detector bias has been cancelled and the zero reader is obtained from A/D converter 92. This zero biasing of detector 88 is performed periodically by the preferred embodiment during normal operation so as to automatically compensate for component drift, temperature, power supply drift, etc.

At block 236, microcontroller 76 enters an outer loop which is repeated once for each of plural frequencies across the spectrum analyzer frequency range of interest (in the preferred embodiment, twenty-four equally spaced frequencies are selected, and the selected frequencies are the same as those selected for gain correction as described above). Microcontroller 76 then controls MUX 96 to connect the output of PLL loop filter 102 to the input of DAC 98 and writes programming values to PLL chip 100 so as to select a desired frequency (block 238). Microcontroller 76 next waits for PLL 94 to settle and lock on the programmed frequency (about 50 ms), and then samples the VCO control voltage CV produced by loop filter 102 using A/D converter 92.

PLL 94 provides relatively high accuracy, so that once it has settled the local oscillator frequency $F_{LO}$ will be close to the desired frequency specified by microcontroller 76 (within a tolerance range). Microcontroller 76 uses this locked PLL as a standard, and samples the VCO control voltage output VC provided by PLL loop filter 102 to VCO 98 (block 240). The microcontroller 76 reads this value into it internal RAM and scales it as necessary (e.g., in the preferred embodiment, DAC provides 10 bits of resolution while A/D converter provides only 8 bits, so that scaling involves simply shifting the read in value to the right by two bit positions). Microcontroller 76 then controls MUX 96 to select the output of DAC 90b in lieu of the output of loop filter 102 as the source of VCO control voltage VC (block 242). This step accomplishes simultaneously the results of (a) connecting the output of DAC 90b to control VCO 98 in open loop connection, and (b) configuring PLL 94 in an open loop connection wherein prescaler 104 continues to receive the output of VCO 98, but the output of the PLL phase comparator and loop filter 102 is no longer connected to control VCO 98 but rather is connected only to microcontroller 76 and to the input of A/D converter 92. Microcontroller 76 then sets an offset variable D, and begins executing an iterative binary approximation loop at block 244.

The loop executed beginning at block 244 is used by microcontroller 76 to successively adjust the control voltage CV being applied to VCO 98 by DAC 90b so that this control voltage provides a local oscillator frequency $F_{LO}$ at the VCO output that is very close to that frequency provided by the VCO under closed-loop control by PLL 94. While the control voltage CV produced by DAC 90b is guaranteed to be close to the control voltage produced by loop filter 102 (e.g., always within about plus or minus about 100 millivolts for the particular components used in the preferred embodiment), it will not be exactly the same due to errors introduced by the A/D converter 92 and due to further errors introduced by the DAC 90b. Microcontroller 76 uses PLL 94 (now operating in open loop mode such that it cannot control the VCO 98 but continues to monitor the output frequency $F_{LO}$ and to compare that output frequency with programmed standard frequency) as a frequency comparator so as to adjust the actual frequency $F_{LO}$ produced by VCO 98. The number of iterations of such adjustment are limited in the preferred embodiment (to 4 for each frequency) in order to minimize the power on calibration time (about 10 seconds). However, as will be explained, frequency calibration in the preferred embodiment is an ongoing process and is performed continually as long as the spectrum analyzer 50 continues to operate.

In the preferred embodiment, microcontroller 76 sets a loop counter "X" to a maximum number of iterations (e.g., 4), and also sets a variable "D" to a maximum offset value (e.g., a digital value which when added or subtracted from a value being used to control DAC 90b will produce about a 100 mv output voltage change). Microcontroller 76 then writes the scaled digital value read in from A/D converter 92 to DAC 90b (block 246) and waits for the PLL 94 to settle. Since the VCO output frequency $F_{LO}$ under open loop DAC control will be different from the VCO output frequency under closed loop PLL control the phase comparator within PLL chip 100 will detect a difference and produce an output control signal of a level which would normally (i.e., if the VCO 98 were connected to the PLL) cause the VCO frequency to shift in an appropriate direction toward the desired frequency programmed into PLL chip 100 by microcontroller 76 at block 238. Since VCO 98 is now disconnected from loop filter 102, the change in output from loop filter 102 goes unheeded by the VCO. Meanwhile, PLL 94 continues to attempt to compensate VCO 98 by further and further increasing (or decreasing) the control voltage output of loop filter 102. After a sufficient loop settling time (e.g., 50 ms), the output of loop filter 102 will be at either 0 VDC or at 5 VDC (i.e., the maximum or minimum power supply values) depending on whether the current VCO 98 output frequency $F_{LO}$ is greater or less than the frequency PLL chip 100 is programmed for. The output of loop filter 102 is directly connected to an input pin of microcontroller 76 over line 170 in the preferred embodiment, and can be read by the microcontroller is either a TTL (CMOS) logic level 0 or a TTL (CMOS) logic level 1. Thus, microcontroller 74 in the preferred embodiment makes use of PLL 94 to determine whether the open loop controlled frequency output of VCO 98 is high or low (block 250).

Microcontroller 76 either adds or subtracts the previously initialized "D" value to the internally stored value used to control DAC 90b (depending upon whether the PLL loop filter 102 output is read by the microcontroller as a logic level 0 or a logic level 1), and at this time also divides this D value in half (e.g., by shifting right one bit place) (blocks 252, 254). The microcontroller 76 then determines if further iterations are needed (decision block 256). If further iterations are needed, the loop counter is incremented (block 258) and blocks 246-256 are repeated (with blocks 252, 254 using the D values halved from the previous iteration). This iterative process thus provides a binary approximation features in order to more rapidly, on the average, calibrate the DAC digital control value.

After the last iteration for the current frequency (decision block 256), microcontroller 76 determines whether the last frequency has been calibrated for (decision block 260). In the preferred embodiment, the calibrated value is already stored in an appropriate location within a frequency calibration table 400 stored in memory (see FIG. 9) since the control voltage sampled by block 240 is stored and scaled in the same memory location to eventually contain the calibrated frequency calibration value, and the operations of blocks 252, 254 are also performed on this same value. If additional frequencies remain, a frequency or channel value is incremented to a "next" channel (block 262) and blocks 238–260 are repeated for that next frequency (and for each successive frequency). By the time decision block 260 determines that all channels have been frequency calibrated, microcontroller 76 has built in memory the frequency allocation table 400 shown in FIG. 9. This table includes 24 10-bit values (one for each of 24 equally spaced frequencies across the band), with each value occupying two 8-bit words (the upper 6 bits of the upper word are not used in the preferred embodiment). Since only 4 iterations of the frequency calibration routine have been performed, the lower 2 bits of each value have not yet been adjusted in the preferred embodiment (although the upper 8 bits are not guaranteed to be accurate).

Microcontroller 76 then controls display 58 to display a main menu (block 264), scans and displays the RF spectrum requested by the user (blocks 268, 272), and periodically checks user controls 60–66 for key depressions (blocks 268, 272). Microcontroller 76 only displays the spectrum 4 times per second in the preferred embodiment, and therefore has some time left over to continually calibrate. In particular, microcontroller 76 continually "zeros" detector 88 (as described above) at block 270, and also continually adjusts the frequency calibration table 400 values (block 276). With respect to continual frequency calibration, between successive spectrum sweeps the microcontroller 76 selects a least recently updated value of frequency calibration table 400 and performs the steps of blocks 238–242 (without sampling the control voltage at block 240) and the steps of blocks 246–250 with respect to the frequency corresponding to the value to be updated. Microcomputer 76 then increments or decrements the frequency calibration table value by one bit depending upon the output provided by PLL loop filter 102. This continual calibration of all entries of frequency calibration table 400 not only provides fine-tune calibration without requiring a lengthy power-on calibration time, but also adapts spectrum analyzer 50 for component characteristic drift due to temperature change and the like.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A RF spectrum analyzer including spectrum analyzing means for detecting signal amplitudes of spectral components of a RF input signal, a display connected to said spectrum analyzing means which displays said detected signal amplitudes as a function of frequency, and a local oscillator for producing a local oscillator signal that tunes said spectrum analyzing means, said spectrum analyzer having a calibration mode and an operating mode, said local oscillator including:

an oscillator stage which produces said local oscillator signal at a controlled frequency, and
means coupled to said oscillator stage for alternatively: (a) in said calibration mode, operating said oscillator stage in closed loop connection so as to generate a closed loop control signal, (b) in said calibration mode, measuring said closed loop control signal to obtain a frequency calibration factor, and (c) in said operating mode, operating said oscillator stage in open loop connection and applying, to said oscillator stage, an open loop control signal responsive to said obtained frequency calibration factor.

2. A spectrum analyzer as in claim 1 further including means operable in said normal mode for continually adjusting said calibration factor.

3. A RF spectrum analyzer capable of being operated in a calibration mode and in an operating mode, said spectrum analyzer including:

a RF input;
a mixer coupled to said RF input and connected to receive a local oscillator signal, said mixer converting a RF signal present at said RF input to an intermediate frequency signal;
a detector connected to receive said intermediate frequency signal, said detector detecting the amplitude of said intermediate frequency signal;
a display which graphically displays detected signal amplitude as a function of frequency; and
a local oscillator for producing said local oscillator signal, said local oscillator including:
an oscillator stage which produces said local oscillator signal, and
means coupled to said oscillator stage for alternatively: (a) in said calibration mode, operating said oscillator stage in closed loop connection so as to cause said oscillator stage to generate a closed loop control signal, (b) in said calibration mode, obtaining a frequency calibration factor responsive to said closed loop control signal, and (c) in said operating mode, operating said oscillator stage in open loop connection and applying, to said oscillator stage, an open loop control signal responsive to said obtained frequency calibration factor.

4. A RF spectrum analyzer having a calibration mode and an operating mode and including:

a RF input for receiving a RF signal;
a variable gain stage for changing the amplitude of a signal responsive to said RF signal to provide a variable gain stage output;
a detector connected to receive said variable gain stage output, said detector detecting the amplitude of said variable gain stage output;
a digital microcontroller coupled to said variable gain stage, said microcontroller for:
(a) in said calibration mode, determining RF signal frequency-dependent gain correction factors automatically for plural RF signal frequencies and storing said gain correction factors, and
(b) in said operating mode, controlling the gain of said variable gain stage as a function of frequency in response to said stored gain correction factors; and
a display which displays RF signal amplitude as a function of frequency in response to said detected amplitude.

5. A sampling RF spectrum analyzer for analyzing RF inputs, said spectrum analyzer comprising:
a tunable RF circuit which selects an RF input frequency in response to a local oscillator signal applied thereto;
amplitude detecting means coupled to said tunable RF circuit for detecting the amplitude of RF signals having said selected RF input frequency;
graphical display means for graphically displaying said detected amplitude as a function of frequency;
a microcontroller having at least one digital input and at least one digital output;
digital-to-analog converter means coupled said microcontroller digital output, said digital-to-analog converter means producing a signal having a voltage level responsive to the microcontroller digital output;
a voltage controlled oscillator for producing said local oscillator signal in response to a voltage level applied thereto;
a phase comparator responsive to said local oscillator signal, said phase comparator comparing the phase of said local oscillator signal with a reference and for producing phase comparator output signal; and
switch means connected to said digital-to-analog converter, to said phase comparator, and to said voltage controlled oscillator, said switch means having first and second switch states, said switch means for coupling the signal produced by said digital-to-analog converter to said voltage controlled oscillator in said first switch state, said switch means coupling the phase comparator output signal to said voltage controlled oscillator in said second state.

6. A spectrum analyzer as in claim 5 wherein said microcontroller includes a further output which commands the switch state of said switch means.

7. A spectrum analyzer as in claim 5 wherein said microcontroller includes a further digital input that is responsive to the phase comparator output signal.

8. A spectrum analyzer as in claim 5 further including a divider having a programmable division factor, said divider dividing said local oscillator signal for application to said phase comparator.

9. A spectrum analyzer as in claim 8 wherein said microcontroller includes a further digital output coupled to command the programmable divider division factor.

10. In a sampling RF spectrum analyzer for analyzing RF inputs, said spectrum analyzer including a tunable RF circuit arrangement which selects RF frequencies in response to a local oscillator signal applied thereto, an amplitude detector coupled to said tunable RF circuit arrangement for detecting the amplitude of RF input signals at said selected frequencies, and a display which graphically displays said detected amplitudes as a function of frequency, a local oscillator arrangement comprising:
a voltage controlled oscillator for producing said local oscillator signal in response to a signal level applied to an input thereof;
a phase comparator producing a phase comparison output responsive at least in part to the phase of said local oscillator signal;
a programmable circuit that produces a signal having a controlled level; and
a multiplexer, connected to said programmable circuit, said phase comparator and said voltage controlled oscillator, said multiplexer having first and second alternative switch states, said multiplexer applying the output of said programmable circuit to said voltage controlled oscillator in said first switch state, said multiplexer applying the phase comparison output to said voltage controlled oscillator in said second switch state.

11. An RF spectrum analyzer comprising:
RF circuitry which detects RF signal amplitudes over an RF signal spectrum, said RF circuitry including an oscillator having an output frequency and operating alternatively in: (i) a phase locked loop connection, and (ii) an open loop connection;
a display device coupled to said RF circuitry, said display device graphically displaying said detected RF signal amplitudes as a function of radio frequency; and
a controller coupled to at least said RF circuitry, said controller performing the following functions:
(a) acquiring frequency calibration data from said oscillator operating in said phase locked loop connection, and
(b) controlling, with said acquired frequency calibration data, the output frequency of said oscillator operating in said open loop connection.

12. A method of analyzing the spectrum of an RF input signal comprising:
(a) acquiring frequency calibration data from an oscillator operating in a phase locked loop connection;
(b) commanding, in response to said acquired frequency calibration data, said oscillator operating in an open loop connection to tune to a sequence of radio frequencies; and
(c) detecting and graphically displaying the amplitude of said RF input signal as a function of said sequence of radio frequencies.

13. A method as in claim 12 wherein said acquiring step includes commanding said oscillator to operate in said phase locked loop connection.

14. A method of analyzing a spectrum of RF signals comprising:
(a) acquiring frequency calibration data from an oscillator operating in a phase locked loop connection;
(b) selecting a sequence of radio frequencies by successively commanding, in response to said acquired frequency calibration data, said oscillator operating in an open loop connection to tune to different frequencies; and
(c) detecting and graphically displaying RF signal amplitude as a function of said selected sequence of radio frequencies,
wherein said acquiring step includes commanding said oscillator to tune to plural frequencies, and sensing and storing the level of an oscillator parameter at each of said plural frequencies.

15. A method of analyzing a spectrum of RF signals comprising:
(a) acquiring frequency calibration data from an oscillator operating in a phase locked loop connection;
(b) selecting a sequence of radio frequencies by successively commanding, in response to said acquired frequency calibration data, said oscillator operating in an open loop connection to tune to different frequencies; and
(c) detecting and graphically displaying RF signal amplitude as a function of said selected sequence of radio frequencies, wherein said acquiring step includes the step of digitally acquiring plural frequency calibration values corresponding to different radio frequencies, and storing said plural calibration values in a digital memory.

16. A method as in claim 12 including interleaving performance of said step (a) with performance of steps (b) and (c).

17. A method of analyzing an RF spectrum comprising:
   storing frequency-dependent gain correction factors for plural RF signal frequencies;
   controlling the gain of a variable gain stage as a function of tuning frequency in response to said stored plural gain correction factors; and
   graphically displaying a frequency domain display of RF signals passed through said variable gain stage.

18. A method as in claim 17 wherein said determining and storing step includes the step of coupling a broadband RF noise spectrum to a frequency selective stage which is coupled to said variable gain stage, and tuning said frequency selective stage to plural different frequencies across said noise spectrum.

19. A method as in claim 17 wherein said controlling step comprises converting stored digital values to analog signal levels, and applying said analog signal levels to control the gain of said variable gain stage.

20. A system for analyzing the frequency spectrum of an RF input signal comprising:
   gain correcting means for storing frequency-dependent gain correction factors for plural RF signal frequencies;
   a variable amplifier stage, coupled to receive said RF input signal, for amplifying said RF input signal so as to generate an amplified output signal;
   means coupled to said gain correcting means for controlling the gain of said variable amplifier stage as a function of tuning frequency in response to said stored plural frequency-dependent gain correction factors; and
   means coupled to said variable amplifier stage for graphically displaying, as a function of tuning frequency, the amplified output signal outputted by said variable amplifier stage.

21. A method of analyzing a spectrum of an RF input signal comprising:
   (a) converting digital values to analog levels;
   (b) applying said analog levels to control the frequency output of a tuning oscillator;
   (c) monitoring the output of a phase comparator coupled to receive said tuning oscillator frequency output;
   (d) compensating said digital values for non-linearities in said converting step (a) in response to said monitored phase comparator output; and
   (e) detecting and graphically displaying said RF input signal as a function of said tuning oscillator frequency output.

* * * * *